US006203404B1

(12) United States Patent
Joslyn et al.

(10) Patent No.: US 6,203,404 B1
(45) Date of Patent: Mar. 20, 2001

(54) CHEMICAL MECHANICAL POLISHING METHODS

(75) Inventors: Michael J. Joslyn, Boise; Sidney B. Rigg, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/325,315

(22) Filed: Jun. 3, 1999

(51) Int. Cl.$^7$ ........................................................ B24B 1/00
(52) U.S. Cl. ............................... 451/37; 451/57; 451/41; 216/88; 216/89; 216/99
(58) Field of Search .................................. 451/41, 57, 36, 451/37; 438/692, 693; 216/88, 89, 99

(56) References Cited

U.S. PATENT DOCUMENTS

| 5,216,843 | | 6/1993 | Breivogel et al. . | |
|---|---|---|---|---|
| 5,676,587 | * | 10/1997 | Landers et al. ........................ | 451/57 |
| 5,795,495 | * | 9/2000 | Meikle .................................... | 216/88 |
| 5,800,251 | * | 9/1998 | Nakazato et al. ....................... | 451/41 |
| 5,816,891 | | 10/1998 | Woo . | |
| 5,897,426 | * | 4/1999 | Somekh .................................. | 451/41 |
| 5,913,712 | * | 6/1999 | Molinar .................................. | 451/41 |
| 5,985,755 | * | 11/1999 | Bajaj et al. ............................. | 438/645 |
| 6,069,081 | * | 5/2000 | Kelleher et al. ....................... | 438/692 |
| 6,071,816 | * | 6/2000 | Watts et al. ............................ | 438/692 |
| 6,117,351 | * | 9/2000 | Li et al. .................................. | 216/99 |

* cited by examiner

Primary Examiner—Joseph J. Hail, III
Assistant Examiner—George Nguyen
(74) Attorney, Agent, or Firm—Wells, St. John, Roberts, Gregory & Matkin P.S.

(57) ABSTRACT

In one implementation, a chemical mechanical polishing method includes providing a workpiece having a dielectric region to be polished. A first chemical mechanical polishing of the dielectric region is conducted on the workpiece using a polishing pad and a first slurry. Then, a second chemical mechanical polishing is conducted of the dielectric region on the workpiece using the polishing pad and a second slurry different from the first slurry. In one implementation, a chemical mechanical polishing method includes providing a workpiece having a dielectric region to be polished. The dielectric region has a thickness ultimately desired to removed by polishing prior to moving the workpiece on to a subsequent nonpolishing processing step. A first chemical mechanical polishing of the dielectric region is conducted on the workpiece using a first slurry. Then, a second chemical mechanical polishing of the dielectric region is conducted on the workpiece using a second slurry different from the first slurry. The second chemical mechanical polishing removes at least 15% of the thickness.

45 Claims, 2 Drawing Sheets

CHEMICAL MECHANICAL POLISHING METHODS

TECHNICAL FIELD

This invention relates to chemical mechanical polishing.

BACKGROUND OF THE INVENTION

Chemical mechanical polishing is one technique utilized to process the outer surface of one or more layers formed over a semiconductor wafer. One principal use of chemical mechanical polishing is to render an outer wafer surface of a layer or layers of dielectric material to be more planar than existed prior to starting the polishing. Only some or all of the outermost layer being polished might be removed during such a process.

In chemical mechanical polishing, typically both the wafer and the pad which polishes the wafer are caused to rotate during the polishing action, typically in opposite directions. A liquid slurry is received intermediate the wafer and the polishing pad. The slurry comprises a liquid solution, typically basic, and a solid grit material, typically particles of a substantially consistent size (i.e., within 5 nanometers of the size selected from around 25 to 100 nanometers in diameter). The action of the liquid solution and grit within the solution intermediate the wafer and pad imparts removal of outer wafer layers utilizing both chemical and mechanical actions.

Although it is the intent of chemical mechanical polishing and other planarization processes to planarize a layer essentially completely flat, undesired finished topography can result depending upon the polishing conditions, the slurry and the materials being polished. It would be desirable in most instances to reduce the degree of residual topography remaining at the conclusion of a chemical mechanical polishing planarization process.

SUMMARY

In one implementation, a chemical mechanical polishing method includes providing a workpiece having a dielectric region to be polished. A first chemical mechanical polishing of the dielectric region is conducted on the workpiece using a polishing pad and a first slurry. Then, a second chemical mechanical polishing is conducted of the dielectric region on the workpiece using the polishing pad and a second slurry different from the first slurry.

In one implementation, a chemical mechanical polishing method includes providing a workpiece having a dielectric region to be polished. The dielectric region has a thickness ultimately desired to removed by polishing prior to moving the workpiece on to a subsequent nonpolishing processing step. A first chemical mechanical polishing of the dielectric region is conducted on the workpiece using a first slurry. Then, a second chemical mechanical polishing of the dielectric region is conducted on the workpiece using a second slurry different from the first slurry. The second chemical mechanical polishing removes at least 15% of the thickness.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
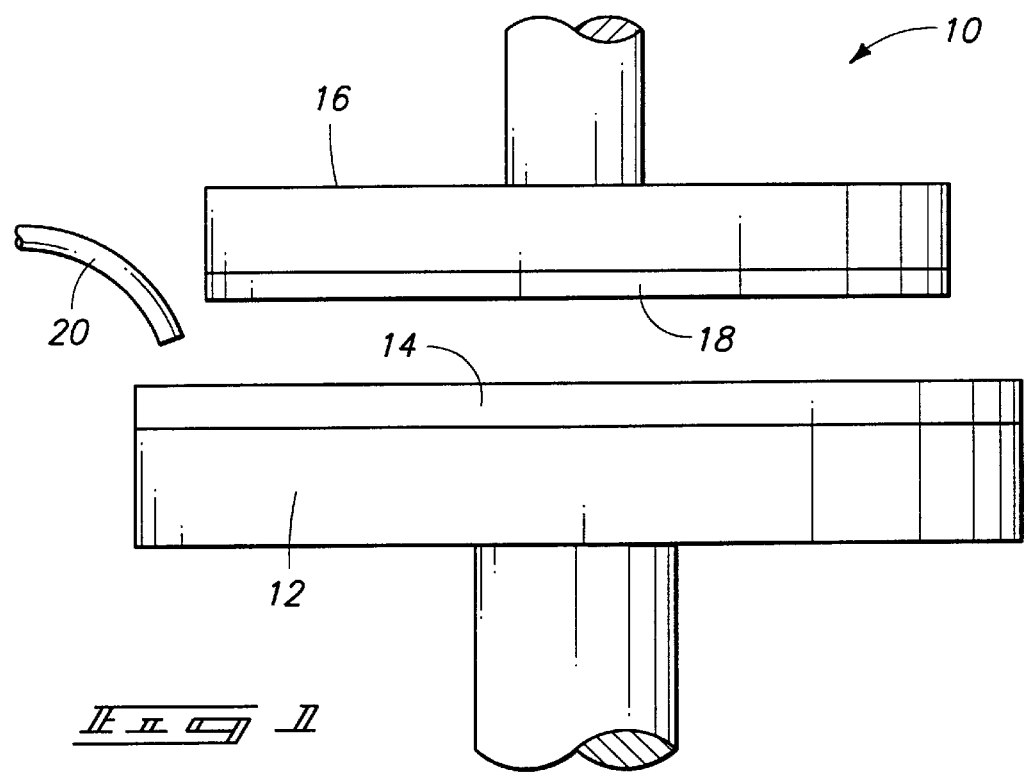
FIG. 1 is a diagrammatic representation of chemical mechanical polishing equipment.

Referring to FIG. 1, an exemplary system shown in a diagrammatic or schematic form for conducting a chemical mechanical polishing method in accordance with the invention is indicated generally with reference numeral 10. Such comprises a polishing table or platen 12 having a polishing pad 14 received thereatop. A wafer carrier 16 is juxtaposed in opposing relation relative to polishing table 14. A workpiece 18, typically in the form of a semiconductor wafer, is received by wafer carrier 16. A slurry or other fluid injection port 20 is positioned to emit fluid onto pad 14 to be received between pad 14 and wafer 18 during polishing. Wafer carrier 16 and polishing table 12 are typically mounted for independent controllable rotation relative to one another. One or more wafer carrier head assemblies might be utilized for a single polishing table, and be mounted for translational movement as well relative to table 12. The above describes but one very diagrammatic exemplary depiction of a chemical mechanical polishing system within which a method of the invention might be utilized.

Figure 2:
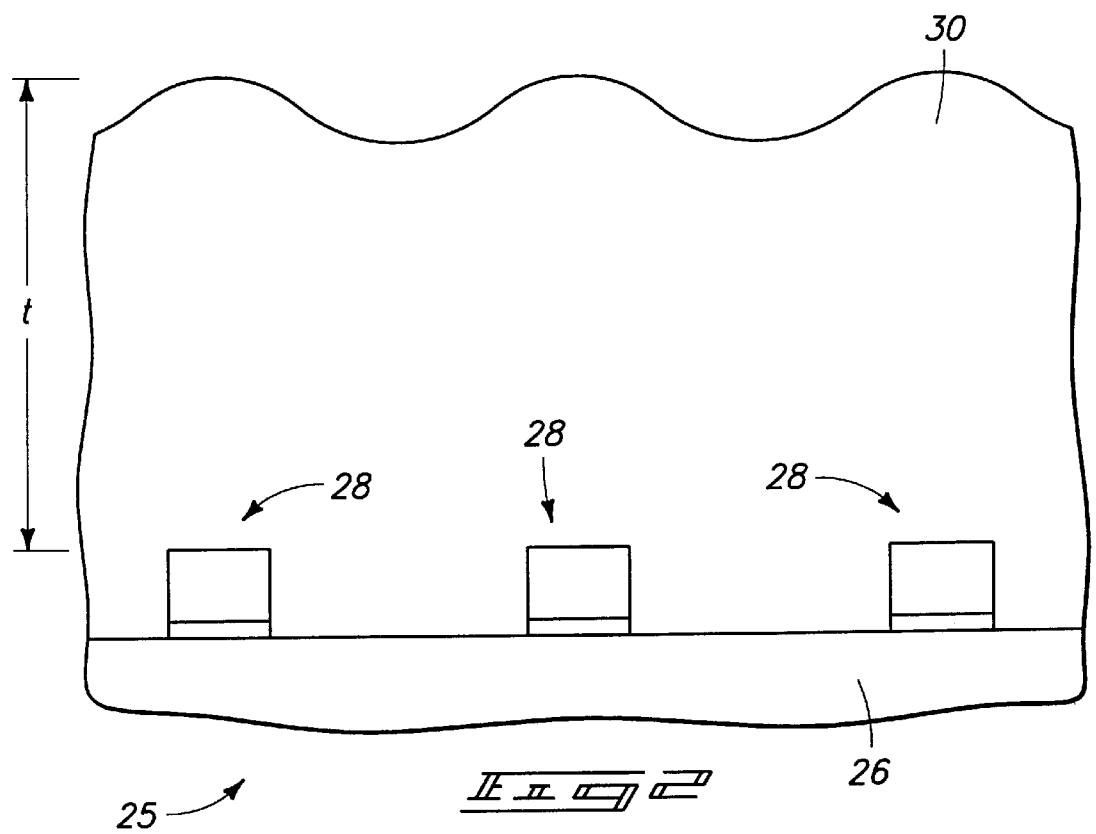
FIG. 2 is a diagrammatic fragmentary view of a semiconductor wafer fragment at one processing step in accordance with the invention.

FIG. 2 illustrates an exemplary workpiece 25 to be chemically mechanically polished. Such comprises a bulk monocrystalline silicon substrate region 26 having a series of three field effect transistor gate lines 28 formed thereover. In the context of this document, the term "semiconductor substrate" or "semiconductive substrate" is defined to mean any construction comprising semiconductive material, including, but not limited to, bulk semiconductive material such as a semiconductive wafer (either alone or in assemblies comprising other materials thereon), and semiconductor material layers (either alone or in assemblies comprising other materials). The term "substrate" refers to any supporting structure, including, but not limited to, the semiconductor substrate describes above.

Workpiece 25 includes a dielectric region 30 to be polished. Region 30 might comprise, by way of example only, doped or undoped oxides, such as borophosphosilicate glass or undoped oxide deposited by decomposition of tetraethylorthosilicate (TEOS). In this example, dielectric region 30 has a nonplanar topography and a thickness "t" ultimately desired to be removed by some polishing action prior to moving the workpiece onto a subsequent nonpolishing processing step. Workpiece 25 constitutes but only one exemplary workpiece, with essentially any other workpiece being usable in accordance with the invention as claimed.

Figure 3:
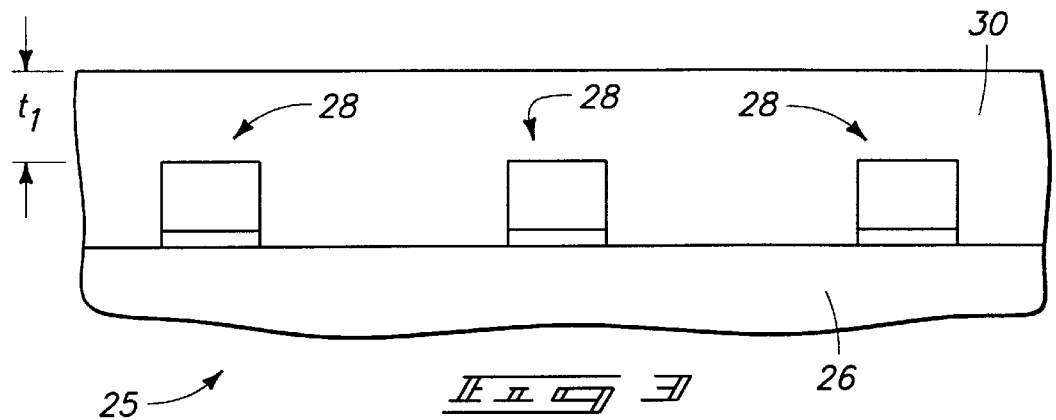
FIG. 3 is a view of the FIG. 2 wafer at a processing step subsequent to that shown by FIG. 2.

Referring to FIG. 3, dielectric region 30 on workpiece 25 is chemical mechanical polished using a first slurry in what is designated as a first chemical mechanical polishing to leave a thickness "$t_1$" of region 30 of the dielectric material remaining to be removed in a desired subsequent polishing removal process. Preferably, $t_1$ is at least 15%, and more preferably at least 20%, of thickness t. Further preferably, the amount of thickness t of dielectric material 30 removed to achieve $t_1$ preferably comprises no more than about 75% of thickness t.

Figure 4:
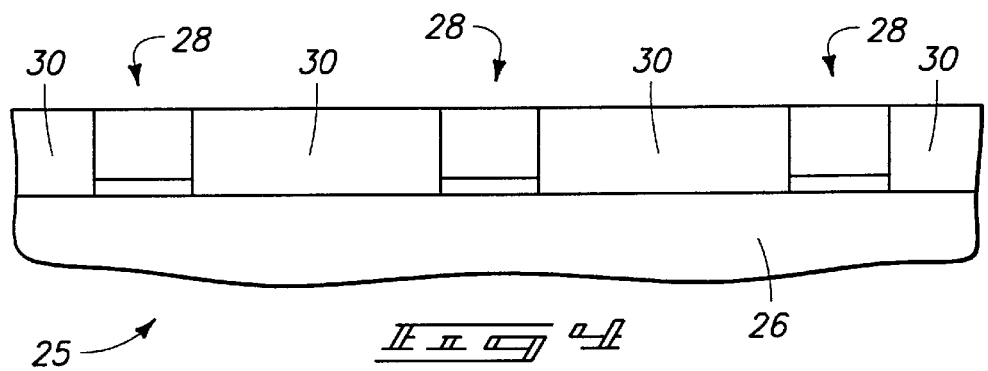
FIG. 4 is a view of the FIG. 1 wafer at a processing step subsequent to that shown by FIG. 3.

Referring to FIG. 4, dielectric region 30 is chemical mechanical polished on workpiece 25 using a second slurry different from the first slurry, and is referred to as a second chemical mechanical polishing of dielectric region 30. The second chemical mechanical polishing comprises one or both of removal of at least 15% of thickness t or polishing with the same pad used in the first chemical mechanical polishing. Accordingly, the invention contemplates doing both, using different polishing pads but where the second chemical mechanical polishing removes at least 15% of the thickness, or using the same pad but removing less than 15% of the thickness. The depicted example shows polishing of region 30 to a point of stopping proximate outer surfaces of conductive gate lines 28, although the invention is of course not so limited. Other workpieces might be utilized and other stopping points (defined by time, layers, etc. or combinations thereof) could be used. Further, dielectric region 30 might constitute one or more dielectric or other materials. Further, this illustrated preferred example depicts a chemical mechanical polishing method wherein the only chemical mechanical polishing of the thickness of the dielectric region being removed prior to moving the workpiece on to a subsequent nonpolishing processing step are the first and second chemical mechanical polishings. Alternately but less preferred, a third or more subsequent chemical mechanical polishing(s) might be conducted.

A preferred difference between the first and second slurries preferably relates to the aggressiveness or selective nature with which the slurries under an otherwise common set of polishing parameters remove material of region 30. Preferably, the first slurry is chosen or designed to remove dielectric material of region 30 at a greater rate than does the second slurry under an otherwise common set of polishing parameters. In this manner in the preferred embodiment only, the first chemical mechanical polishing is conducted to be more aggressive and achieve greater inherent planarity during the first chemical mechanical polishing than would otherwise occur were the second slurry utilized initially in the first polishing under a same common set of parameters. Thereby, an advantage can be achieved in arriving at greater planarity initially, with the second polish being chosen to be more selective and less aggressive in removing material of the dielectric region. A more aggressive first polishing might have a tendency to leave a scratchy and rougher outer surface than would be desired at the conclusion of the polishing. Yet, greater overall planarity might be achieved in the combination polishing, with the second chemical mechanical polishing using a less aggressive slurry resulting in a smoother, more acceptable outer surface at the conclusion of such polish.

In a preferred embodiment, the first chemical mechanical polishing is conducted to remove dielectric material of the first region at a faster rate than during the second polishing. The first and second polishings can be conducted utilizing the same common set of polishing parameters, other than slurry composition, or using different sets of parameters. Example polishing parameters include ambient temperature, pressure, rotational and translational speeds and movements of the pad and wafer relative to one another, and pressure applied between the pad and the wafer during polishing.

The first and second slurries might differ from one another in one or more numbers of ways. For example, particles in the first slurry might differ in average size from particles in the second slurry. The first slurry might have particles which on average are larger in size than particles in the second slurry in an effort to achieve more non-selective, aggressive removal under an otherwise common set of polishing parameters. For example, a specific average particle size for the first stated chemical mechanical polishing might constitute 120 nm, where an average particle size for the second slurry might constitute 15 nm. Further, the particles in the first slurry might differ in composition from particles in the second slurry. For example, the particles in the first slurry might on average be harder than particles in the second slurry to achieve a more aggressive, faster rate, non-selective polish in the first polishing for an otherwise common set of polishing parameters than in the second polishing. For example, the first slurry might use silica ($SiO_2$) particles, while softer ceria particles might be used in a second slurry. Further, the particles in the first and second slurries might differ in both size and composition. Smaller and/or softer particles in the second slurry might facilitate formation of a smoother finished outer surface at the conclusion of the polishing. Further, the particles might differ in shape, or in other manners.

Further, the first and second slurries might have substantially the same chemistry but only a difference in particles, for example any or all of the above differences in size, hardness, shape, etc. Alternately by way of example only, the slurries might differ by having different liquid chemistry which attacks the material being chemical mechanical polished with different aggressiveness for an otherwise common set of polishing parameters. By way of example only, one slurry might be basic and the other acidic. Further by way of example only, the slurries might differ in both chemistry and particle attributes. A final polishing is preferably conducted with pure, deionized water (or other solution) which is substantially void of particles (and thereby not a slurry) for purposes of removing an slurry residual material. Typically, negligible, if any, wafer material is removed by such action.

Figure 5:
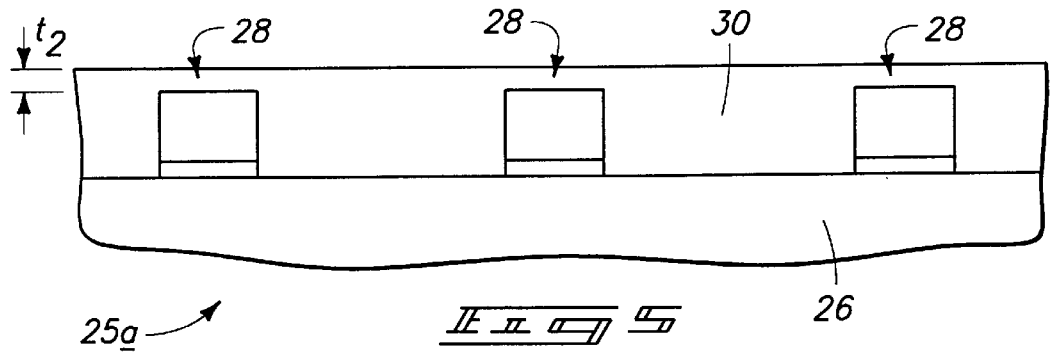
FIG. 5 is a diagrammatic fragmentary view of an alternate semiconductor wafer fragment at one processing step in accordance with the invention.
Figure 6:
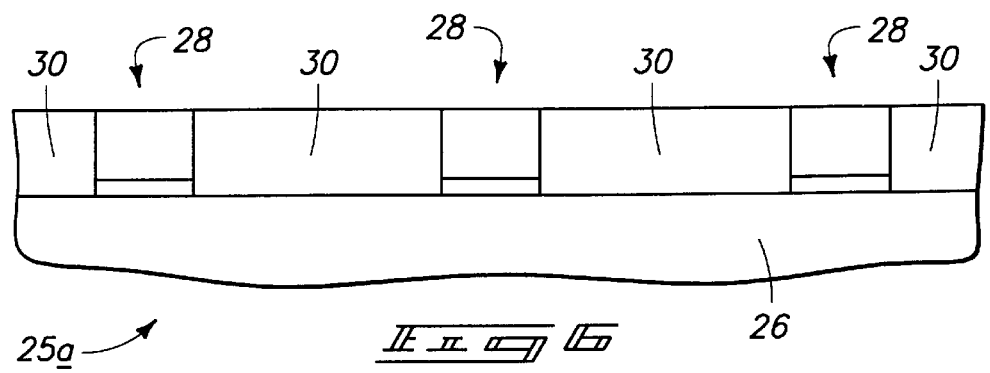
FIG. 6 is a view of the FIG. 5 wafer at a processing step subsequent to that shown by FIG. 5.

The above-described preferred embodiment depicted removal in only two chemical mechanical polishing steps of the desired thickness "t" of the dielectric region being polished prior to moving the wafer on to some immediate or later subsequent nonpolishing processing step. As referred to above, more chemical mechanical polishing(s) might also be conducted. FIGS. 5 and 6 illustrate alternate processing whereby subsequent polishing can also be conducted which may or may not be chemical mechanical polishing. Like numerals from the first described embodiment have been utilized where appropriate, with differences being indicated by the suffix "a" or with different numerals. FIG. 5 depicts second mechanical polishing occurring subsequent to the polishing of FIG. 3, whereby a thickness "$t_2$" remains to be removed at the completion of a second mechanical polishing.

Referring to FIG. 6, a third polishing (i.e., chemical, mechanical, or chemical mechanical) of the wafer has been conducted essentially to achieve the FIG. 4 construction.

Where the dielectric material being polished, for example, comprises one or both of doped or undoped silicon dioxide, an example first slurry is ILD 1300™ available from Rodel, Inc. of Newark, N.J., and a second example slurry is KLEBOSOL 30H50™ also available from Rodel, Inc. The ILD 1300™ slurry has a pH of 11, whereas the KLEBOSOL 30H50™ slurry has a pH of 2.6.

Further, consider a workpiece having a 10,000 Angstroms thick layer of dielectric material to be removed by a chemical mechanical polishing. Consider a desired goal in this example as being the achieving of a final and substantially planar dielectric region thickness of 5,000 Angstroms. Three thousand five hundred (3,500) Angstroms, or 75% of the thickness to be polished, are removed in a first chemical mechanical polishing. In the second chemical mechanical polishing using a different slurry from the first, 1,000 Angstroms, or 20% of the total thickness to be removed, are polished away. Finally, a subsequent polishing is conducted to remove the final 500 Angstroms, or 5% of the total thickness being removed. During the first two chemical mechanical polishings, slurry temperature is maintained at 115° C., polishing conducted at room pressure, with pressure on the wafer being provided at 6 lbs. psi. As an alternate example, the second chemical mechanical polishing could be used to remove 1500 Angstroms and the final or any subsequent polishing eliminated. Further by way of example only, some polishing (chemical, mechanical, or chemical mechanical) might be conducted between the stated first and second chemical mechanical polishings.

Applicant is aware of prior art two-step chemical mechanical polishings using two different slurries on different pads, and multiple pad, multiple slurry chemical mechanical polishings wherein no more than 10% of the thickness being removed occurs in a second, in sequence, of two or more chemical mechanical polishings.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical mechanical polishing method comprising:
   providing a workpiece having a dielectric region to be polished;
   first chemical mechanical polishing the dielectric region on the workpiece using a polishing pad and a first slurry; and
   second chemical mechanical polishing the dielectric region on the workpiece using the polishing pad and a second slurry different from the first slurry.

2. The chemical mechanical polishing method of claim 1 wherein the first chemical mechanical polishing is conducted to remove dielectric material of the first region at a faster rate than during the second polishing.

3. The chemical mechanical polishing method of claim 1 wherein the first slurry removes dielectric material of the region at a greater rate than does the second slurry under a common set of polishing parameters but for slurry composition.

4. The chemical mechanical polishing method of claim 1 wherein the first slurry removes dielectric material of the region at a greater rate than does the second slurry under a common set of polishing parameters but for slurry composition, and wherein the first chemical mechanical polishing is conducted to remove dielectric material of the first region at a faster rate than during the second polishing.

5. The chemical mechanical polishing method of claim 1 wherein the first slurry removes dielectric material of the region at a greater rate than does the second slurry under a common set of polishing parameters but for slurry composition, and wherein the first and second polishings are conducted using the common set of polishing parameters.

6. The chemical mechanical polishing method of claim 1 wherein the first chemical mechanical polishing of the dielectric region is conducted wherein particles in the first slurry differ in average size from particles in the second slurry.

7. The chemical mechanical polishing method of claim 6 wherein the first chemical mechanical polishing of the dielectric region is conducted wherein particles in the first slurry are on average larger in size than particles in the second slurry during the second chemical mechanical polishing of the dielectric region.

8. The chemical mechanical polishing method of claim 1 wherein the first chemical mechanical polishing of the dielectric region is conducted wherein particles in the first slurry differ in composition from particles in the second slurry during the second chemical mechanical polishing of the dielectric region.

9. The chemical mechanical polishing method of claim 8 wherein the first chemical mechanical polishing of the dielectric region is conducted wherein particles in the first slurry are on average harder than particles in the second slurry during the second chemical mechanical polishing of the dielectric region.

10. The chemical mechanical polishing method of claim 1 wherein the first chemical mechanical polishing of the dielectric region is conducted wherein particles in the first slurry differ in average size from particles in the second slurry during the second chemical mechanical polishing of the dielectric region, and wherein the first chemical mechanical polishing of the dielectric region is conducted wherein particles in the first slurry differ in composition from particles in the second slurry during the second chemical mechanical polishing of the dielectric region.

11. The chemical mechanical polishing method of claim 10 wherein the first chemical mechanical polishing of the dielectric region is conducted wherein particles in the first slurry are on average larger in size than particles in the second slurry during the second chemical mechanical polishing of the dielectric region, and wherein the first chemical mechanical polishing of the dielectric region is conducted wherein particles in the first slurry are on average harder than particles in the second slurry during the second chemical mechanical polishing of the dielectric region.

12. The chemical mechanical polishing method of claim 1 wherein the first and second slurries have substantially the same chemistry but a difference in particles of the slurries during the respective first and second chemical mechanical polishings.

13. The chemical mechanical polishing method of claim 12 wherein the difference comprises average size during the respective first and second chemical mechanical polishings.

14. The chemical mechanical polishing method of claim 12 wherein the difference comprises average size during the respective first and second chemical mechanical polishings, the first slurry having larger particles on average than the second slurry during the respective first and second chemical mechanical polishings.

15. The chemical mechanical polishing method of claim 12 wherein the difference comprises particle material during the respective first and second chemical mechanical polishings.

16. The chemical mechanical polishing method of claim 12 wherein the difference comprises particle material during the respective first and second chemical mechanical polishings, the first slurry having harder particles on average than the second slurry during the respective first and second chemical mechanical polishings.

17. The chemical mechanical polishing method of claim 12 wherein the difference comprises average size and particle material during the respective first and second chemical mechanical polishings.

18. The chemical mechanical polishing method of claim 12 wherein the difference comprises average size and particle material during the respective first and second chemical mechanical polishings, the first slurry having larger particles on average than the second slurry during the respective first and second chemical mechanical polishings, the first slurry having harder particles on average than the second slurry during the respective first and second chemical mechanical polishings.

19. The chemical mechanical polishing method of claim 1 further comprising after the second polishing, third polishing the wafer to remove wafer material therefrom.

20. The chemical mechanical polishing method of claim 1 wherein the first and second slurries have different liquid chemistry during the respective first and second chemical mechanical polishings.

21. The chemical mechanical polishing method of claim 20 wherein the different liquid chemistry is characterized at least in part by acid vs. base during the respective first and second chemical mechanical polishings.

22. The chemical mechanical polishing method of claim 21 wherein the first slurry has a pH greater than 7, and the second slurry has a pH less than 7 during the respective first and second chemical mechanical polishings.

23. A chemical mechanical polishing method comprising:
providing a workpiece having a dielectric region to be polished, the dielectric region having a thickness ultimately desired to be removed by polishing prior to moving the workpiece on to a subsequent nonpolishing processing step;
first chemical mechanical polishing the dielectric region on the workpiece using a first slurry; and
second chemical mechanical polishing the dielectric region on the workpiece using a second slurry different from the first slurry, the second chemical mechanical polishing removing at least 15% of the thickness.

24. The chemical mechanical polishing method of claim 23 wherein the first and second chemical mechanical polishings are conducted using the same polishing pad.

25. The chemical mechanical polishing method of claim 23 wherein the first and second chemical mechanical polishings are conducted using different polishing pads.

26. The chemical mechanical polishing method of claim 23 wherein the second chemical mechanical polishing is conducted to remove at least 20% of the thickness.

27. The chemical mechanical polishing method of claim 23 wherein the first chemical mechanical polishing is conducted to remove no more than about 75% of the thickness.

28. The chemical mechanical polishing method of claim 23 wherein the first and second chemical mechanical polishings are conducted using the same polishing pad, and wherein the second chemical mechanical polishing is conducted to remove at least 20% of the thickness.

29. The chemical mechanical polishing method of claim 28 wherein the first chemical mechanical polishing is conducted to remove no more than about 75% of the thickness.

30. The chemical mechanical polishing method of claim 23 wherein the only chemical mechanical polishing of the thickness is said first and second chemical mechanical polishings.

31. The chemical mechanical polishing method of claim 30 further comprising after the second polishing, third polishing the wafer to remove wafer material therefrom.

32. The chemical mechanical polishing method of claim 23 wherein the first chemical mechanical polishing is conducted to remove dielectric material of the first region at a faster rate than during the second polishing.

33. The chemical mechanical polishing method of claim 23 wherein the first slurry removes dielectric material of the region at a greater rate than does the second slurry under a common set of polishing parameters but for slurry composition.

34. The chemical mechanical polishing method of claim 23 wherein the first slurry removes dielectric material of the region at a greater rate than does the second slurry under a common set of polishing parameters but for slurry composition, and wherein the first chemical mechanical polishing is conducted to remove dielectric material of the first region at a faster rate than during the second polishing.

35. The chemical mechanical polishing method of claim 23 wherein the first slurry removes dielectric material of the region at a greater rate than does the second slurry under a common set of polishing parameters but for slurry composition, and wherein the first and second polishings are conducted using the common set of polishing parameters.

36. The chemical mechanical polishing method of claim 23 wherein the first chemical mechanical polishing of the dielectric region is conducted wherein particles in the first slurry differ in average size from particles in the second slurry during the second chemical mechanical polishing of the dielectric region.

37. The chemical mechanical polishing method of claim 36 wherein the first chemical mechanical polishing of the dielectric region is conducted wherein particles in the first slurry are on average larger in size than particles in the second slurry during the second chemical mechanical polishing of the dielectric region.

38. The chemical mechanical polishing method of claim 23 wherein the first chemical mechanical polishing of the dielectric region is conducted wherein particles in the first slurry differ in composition from particles in the second slurry during the second chemical mechanical polishing of the dielectric region.

39. The chemical mechanical polishing method of claim 38 wherein the first chemical mechanical polishing of the dielectric region is conducted wherein particles in the first slurry are on average harder than particles in the second slurry during the second chemical mechanical polishing of the dielectric region.

40. The chemical mechanical polishing method of claim 23 wherein the first chemical mechanical polishing of the dielectric region is conducted wherein particles in the first slurry differ in average size from particles in the second slurry during the second chemical mechanical polishing of the dielectric region, and wherein the first chemical mechanical polishing of the dielectric region is conducted wherein particles in the first slurry differ in composition from particles in the second slurry during the second chemical mechanical polishing of the dielectric region.

41. The chemical mechanical polishing method of claim 40 wherein the first chemical mechanical polishing of the dielectric region is conducted wherein particles in the first slurry are on average larger in size than particles in the second slurry during the second chemical mechanical polishing of the dielectric region, and wherein the first chemical mechanical polishing of the dielectric region is conducted wherein particles in the first slurry are on average harder than particles in the second slurry during the second chemical mechanical polishing of the dielectric region.

42. The chemical mechanical polishing method of claim 23 wherein the first and second slurries have substantially the same chemistry but a difference in particles of the slurries during the respective first and second chemical mechanical polishings.

43. The chemical mechanical polishing method of claim 23 wherein the first and second slurries have different liquid chemistry during the respective first and second chemical mechanical polishings.

44. The chemical mechanical polishing method of claim 43 wherein the different liquid chemistry is characterized at least in part by acid vs. base during the respective first and second chemical mechanical polishings.

45. The chemical mechanical polishing method of claim 44 wherein the first slurry has a pH greater than 7, and the second slurry has a pH less than 7 during the respective first and second chemical mechanical polishings.

* * * * *